United States Patent
Shin

(10) Patent No.: US 8,289,666 B2
(45) Date of Patent: Oct. 16, 2012

(54) MEMORY MODULE FOR PREVENTING ELECTROSTATIC DISCHARGE (ESD) AND SYSTEM INCLUDING THE SAME

(75) Inventor: Young Joon Shin, Hwasung-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 287 days.

(21) Appl. No.: 12/662,104

(22) Filed: Mar. 31, 2010

(65) Prior Publication Data

US 2010/0328835 A1 Dec. 30, 2010

(30) Foreign Application Priority Data

Jun. 25, 2009 (KR) .................. 10-2009-0056965

(51) Int. Cl.
*H02H 9/00* (2006.01)
(52) U.S. Cl. ........................................................ 361/56
(58) Field of Classification Search .................. 361/56
See application file for complete search history.

(56) References Cited

U.S. PATENT DOCUMENTS

| 5,369,552 | A  | * | 11/1994 | Barnes et al. | 361/816 |
| 5,959,821 | A  | * | 9/1999 | Voogel | 361/111 |
| 6,241,537 | B1 | * | 6/2001 | Tate et al. | 439/108 |
| 6,288,885 | B1 |   | 9/2001 | Jiang | |
| 7,477,494 | B2 | * | 1/2009 | Icher et al. | 361/56 |
| 2010/0296256 | A1 | * | 11/2010 | Gillingham et al. | 361/729 |

FOREIGN PATENT DOCUMENTS

| JP | 10-242378 | 9/1998 |
| KR | 92-7360 | 4/1992 |
| KR | 10-2001-0010701 | 2/2001 |

* cited by examiner

*Primary Examiner* — Ronald W Leja
(74) *Attorney, Agent, or Firm* — Harness, Dickey & Pierce, P.L.C.

(57) ABSTRACT

Disclosed is a memory module having an ElectroStatic Discharge (ESD) prevention structure. The memory module may include a printed circuit board, a first circuit pattern on the printed circuit board, and a second circuit pattern on the printed circuit board. The second circuit pattern may be configured to discharge static electricity introduced to the memory module from outside the memory module. In addition, the second circuit pattern is not connected to the first circuit pattern. Disclosed also is a system that includes the memory module. The system may include a main board, a socket on the main board, and the memory module.

13 Claims, 8 Drawing Sheets

MEMORY MODULE FOR PREVENTING ELECTROSTATIC DISCHARGE (ESD) AND SYSTEM INCLUDING THE SAME

CROSS-REFERENCE TO RELATED APPLICATIONS

This application claims priority under 35 U.S.C. §119 to Korean Patent Application No. 10-2009-0056965, filed on Jun. 25, 2009, in the Korean Intellectual Property Office (KIPO), the disclosure of which is incorporated by reference herein in its entirety.

BACKGROUND

1. Field

Example embodiments of the present invention relate to a memory module, and more particularly, to a memory module for preventing ElectroStatic Discharge (ESD) and a system including the same.

2. Description of the Related Art

ElectroStatic Discharge (ESD) occurs from persons or objects such as machines, paper, or plastic. In particular, ESD generated in the hands of a person has an amplitude of several to several tens of Amperes (A). When a person or a machine deals with a memory module of a complete product state, for example, a dynamic random access memory (DRAM) in which a plurality of memory devices are embedded on a printed circuit board (PCB), such ESD causes the memory devices mounted on the PCB to be permanently damaged or malfunction.

In a general manufacturing process, workers handle PCBs by wearing a band to which a ground line is attached on their wrists, in order to prevent memory modules from being damaged due to ESD. However, it is difficult to anticipate that consumers or repairmen of memory devices accurately wear such a band for ESD prevention.

Accordingly, ESD generated from consumers or repairmen damages memory devices mounted on a PCB, and the damaged memory devices impedes a normal operation of a memory module or a system including the memory module.

SUMMARY

Example embodiments of the present invention provide a memory module for preventing ElectroStatic Discharge (ESD) and a system including the same.

In accordance with an example embodiment of the present invention, a memory module having an ElectroStatic Discharge (ESD) prevention structure may include a printed circuit board, a first circuit pattern on the printed circuit board, and a second circuit pattern on the printed circuit board. In this example embodiment, the second circuit pattern may be configured to discharge static electricity introduced to the memory module from outside the memory module. In addition, the second circuit pattern is not connected to the first circuit pattern.

In accordance with an example embodiment of the present invention, a system may include a main board on which a plurality of electronic components are mounted, a socket on the main board, and a memory module in the socket and connected to the main board via the socket. In this example embodiment, the memory module may include a printed circuit board, a first circuit pattern on the printed circuit board, and a second circuit pattern on the printed circuit board. In this example embodiment, the second circuit pattern may be configured to discharge static electricity introduced to the memory module from outside the memory module. In addition, the second circuit pattern is not connected to the first circuit pattern.

In accordance with an example embodiment of the present invention, a memory module having an ESD prevention structure may include a printed circuit board, a first circuit pattern formed on the printed circuit board, and a second circuit pattern formed on the printed circuit board so as not to be connected to the first circuit pattern, for discharging static electricity introduced from the outside.

In accordance with another example embodiment of the present invention, a system may include a main board on which a plurality of electronic components are mounted, a socket combined with the main board, and a memory module inserted into the socket and connected to the main board via the socket.

BRIEF DESCRIPTION OF THE DRAWINGS

Example embodiments of the present invention will be more clearly understood from the following detailed description taken in conjunction with the accompanying drawings in which.

DETAILED DESCRIPTION OF THE EXAMPLE EMBODIMENTS

Figure 1:
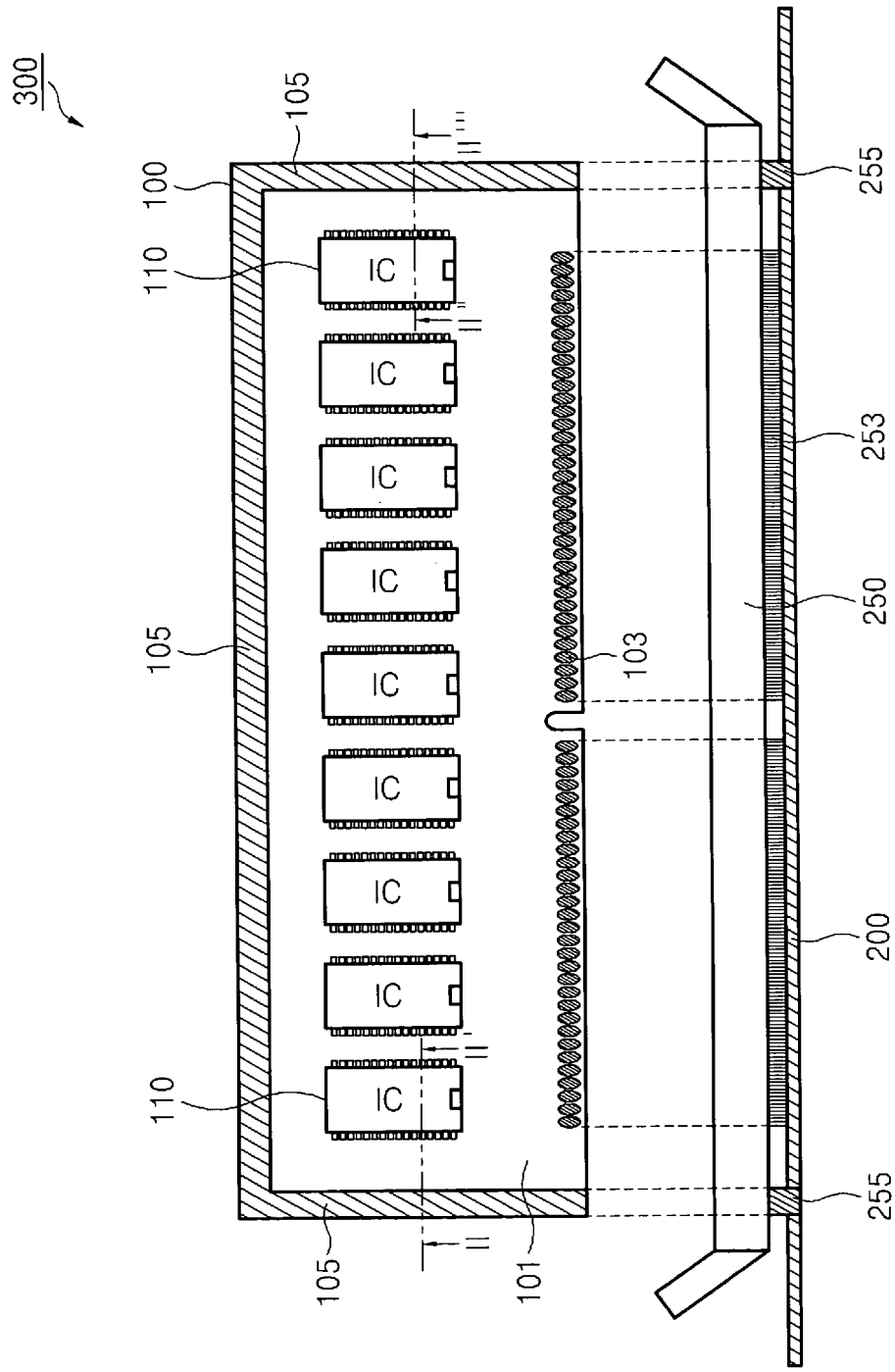
FIG. 1 is a schematic diagram of a system including a memory module for preventing ElectroStatic Discharge (ESD), according to an example embodiment of the present invention.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 4:
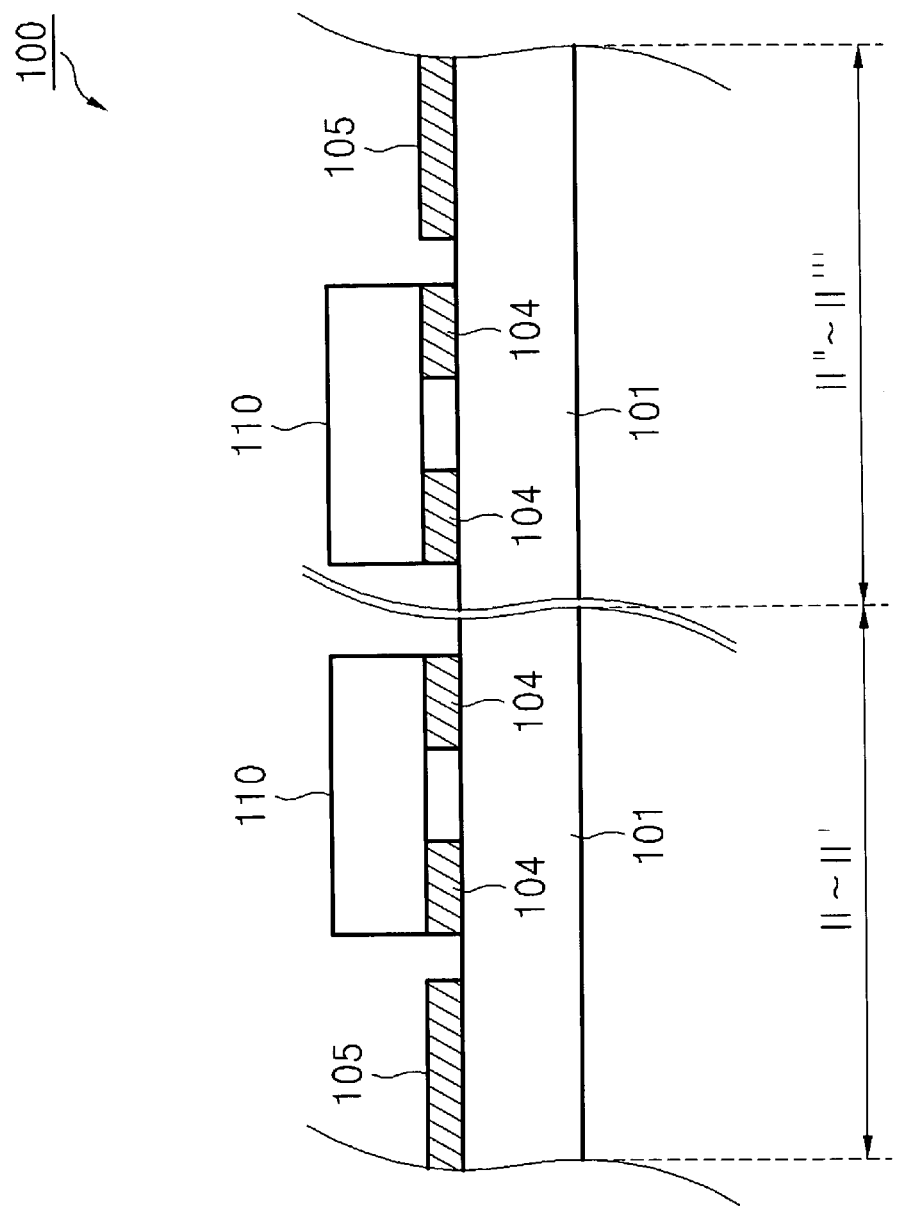
FIG. 4 is a cross-section of the memory module of FIGS. 1, 2, and 3 taken along lines II~II' and II"~II'" of FIGS. 1, 2, and 3.

FIG. 1 is a schematic diagram of a system 300 including a memory module 100 for preventing ElectroStatic Discharge (ESD), according to an example embodiment of the present invention. FIG. 4 is a cross-section of the memory module 100 of FIG. 1 taken along lines II~II' and II"~II"'.

In the present example embodiment, for convenience of explanation, the memory module 100 is a dynamic random access memory (DRAM) module, and the system 300 including the memory module 100 is a computer system. However, the present invention is not limited thereto. In other words, the memory module 100 may be a memory module including a volatile memory such as a DRAM or a non-volatile memory such as flash memory, and the system 300 may be an electronic system including the memory module 100.

Referring to FIGS. 1 and 4, the system 300 may include the memory module 100, a socket 250, and a main board 200. The socket 250 and the main board 200 may be combined with each other to realize a computer system.

For example, a plurality of connection terminals, e.g., a plurality of first connection terminals 253 and a plurality of second connection terminals 255, may be formed below the socket 250. Each of the first connection terminals 253 may be connected to a circuit pattern (not shown) formed on the main board 200 according to a surface mounting method, for example.

The second connection terminals 255 may be formed below both lateral ends of the socket 250. The second connection terminals 255 may penetrate through the main board 200 and be combined with the main board 200. The second connection terminals 255 may be connected to a ground, for example, a ground pattern, of the main board 200. The ground pattern of the main board 200 may be a ground formed in the form of a line or a surface on the main board 200.

A plurality of electronic components (not shown) in addition to the memory module 100 may be mounted on the main board 200. A circuit pattern capable of being electrically connected to the electronic components may be formed on the main board 200.

The memory module 100 may include a printed circuit board (PCB) 101 and a plurality of electronic components, for example, a plurality of volatile or non-volatile memory devices 110 having integrated circuits (IC), mounted on the PCB 101. The volatile memory devices mounted on the memory module 100 may be, for example, DRAM or static random access memory (SRAM) memory devices. The non-volatile memory devices mounted on the memory module 100 may be NOR flash or NAND flash memory devices.

Figure 2:
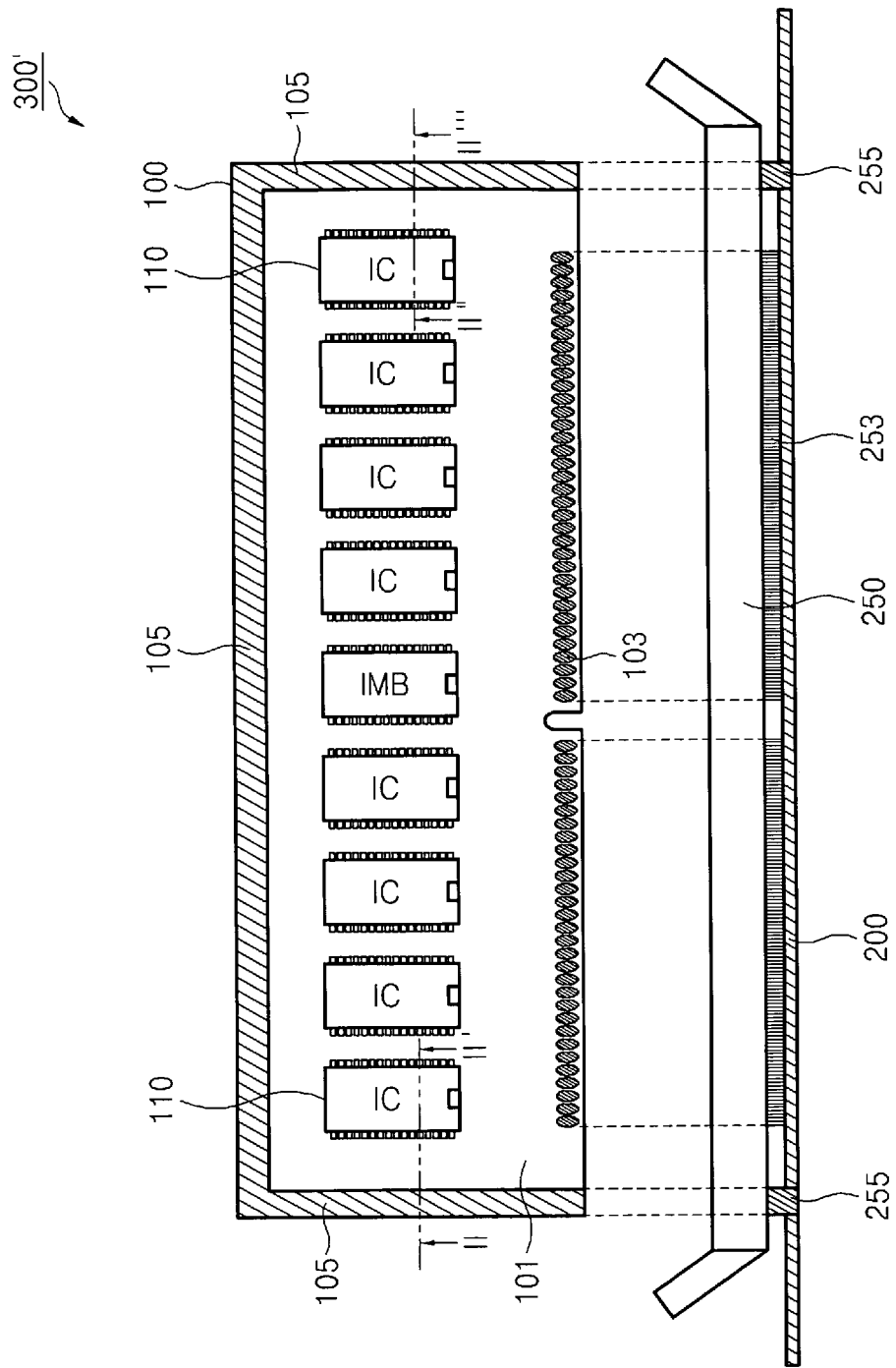
FIG. 2 is a schematic diagram of a system including a memory module for preventing ElectroStatic Discharge (ESD), according to another example embodiment of the present invention.
Figure 3:
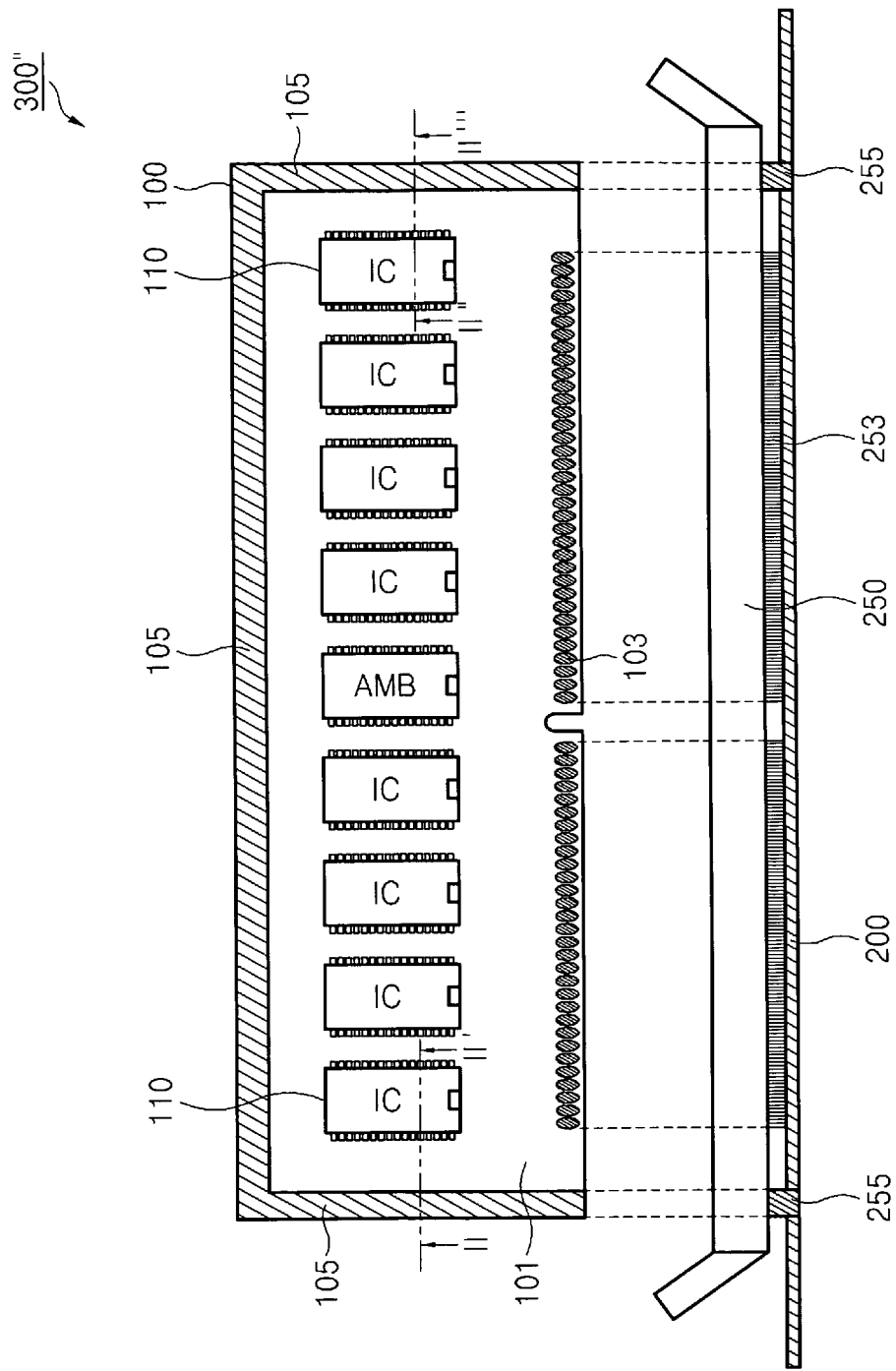
FIG. 3 is a schematic diagram of a system including a memory module for preventing ElectroStatic Discharge (ESD), according to still another example embodiment of the present invention.
Figure 6:
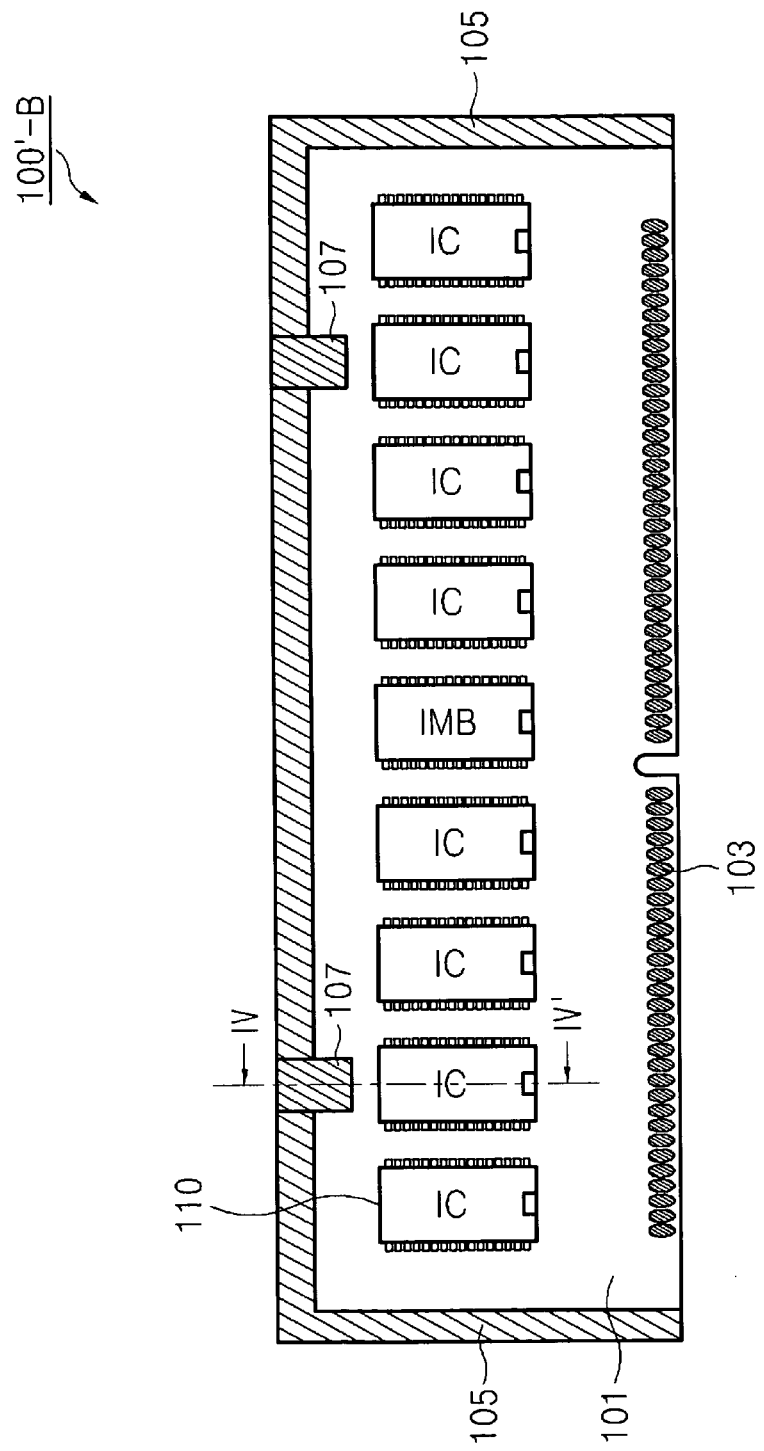
FIG. 6 is a schematic diagram of a memory module for preventing ESD, according to still another example embodiment of the present invention.
Figure 7:
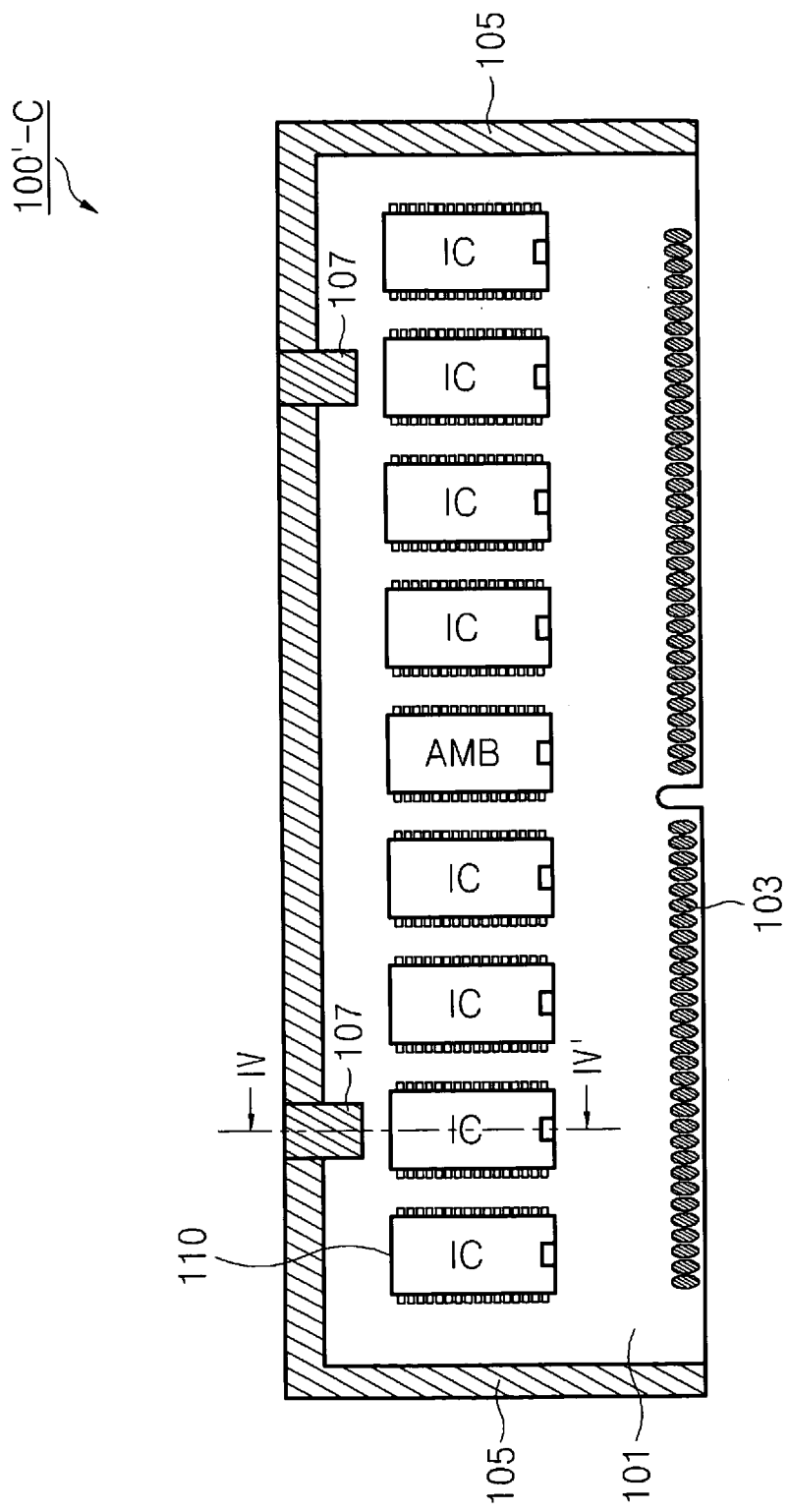
FIG. 7 is a schematic diagram of a memory module for preventing ESD, according to still another example embodiment of the present invention.

The memory module 100 may be inserted into the socket 250 and connected to the main board 200. The memory module 100 may store data provided from the main board 200, or output data stored in the memory devices 110 to the main board 200 via the socket 250. The memory module 100 may be a Single Inline Memory Module (SIMM), a Double Inline Memory Module (DIMM), Load-Reduced Dual Inline Memory Module (LRDIMM) as shown in FIGS. 2 and 6 or Fully Buffered Dual In-line Memory Module (FBDIMM) as shown in FIGS. 3 and 7.

The PCB 101 may include a plurality of terminals 103, a first circuit pattern 104, and a second circuit pattern 105. The terminals 103 of the PCB 101 may be formed in a lower portion of the PCB 101. When the memory module 100 is inserted into the socket 250, the terminals 103 may be connected to the first connection terminals 253 of the socket 250.

The first circuit pattern 104 may be formed on a first area of the PCB 101, for example, a substantial area of the memory module 100, namely, an area on which the memory devices 110 are mounted and a first area on which the terminals 103 are formed. The first circuit pattern 104 may connect the memory devices 110 to the terminals 103.

In other words, the memory devices 110 may be mounted on the first circuit pattern 104. The memory devices 110 may be connected to the first connection terminals 253 of the socket 250 via the first circuit pattern 104 and the terminals 103. Accordingly, when the memory module 100 has been inserted into the socket 250, the memory devices 110 of the memory module 100 may store the data provided from the main board 200 or may output the data stored in the memory devices 110 to the main board 200 via the socket 250.

The second circuit pattern 105 may be formed on a second area of the PCB 101, for example, an area other than the first area of the PCB 101. The second circuit pattern 105 may be formed along an outer edge of the PCB 101 and is not electrically connected to the first circuit pattern 104. When the memory module 100 has been inserted into the socket 250, the second circuit pattern 105 may be connected to the second connection terminals 255 of the socket 250 and may be connected to the ground of the main board 200. The second circuit pattern 105 may be used to prevent ESD from occurring in the memory module 100.

Referring to FIG. 4, the first circuit pattern 104 may be formed on the first area of the PCB 101, and the memory devices 110 may be mounted on the first circuit pattern 104.

The second circuit pattern 105 may be formed on the second area of the PCB 101, and the second circuit pattern 105 may not be connected to the first circuit pattern 104. The first circuit pattern 104 and the second circuit pattern 105 may be formed of a highly conductive metal such as copper (Cu). The first circuit pattern 104 may be shielded by the memory devices 110, but the second circuit pattern 105 may be exposed to the outside. In order to increase the shielding effect, a protection film (not shown) may be further formed on a portion of the first circuit pattern 104 other than a portion of the first circuit pattern 104 on which the memory devices 110 are mounted.

As described above with reference to FIGS. 1 and 4, when static electricity introduced from the outside, for example, static electricity generated from people or machines, enters the memory module 100, the memory module 100 may effectively discharge the static electricity. For example, if static electricity is flowed from the outside into the memory module 100 when the memory module 100 has been inserted into the socket 250, the static electricity may be discharged into the ground of the main board 200 via the second circuit pattern 105 formed along the outer edge of the PCB 101 of the memory module 100 and the second connection terminals 255 of the socket 250.

In the instant example embodiment, the first circuit pattern 104 of the PCB 101 of the memory module 100 may be in a shielded state, and the second circuit pattern 105 thereof may be in an exposed state. In other words, the static electricity introduced from the outside into the memory module 100 may be discharged into the ground pattern of the main board 200 via the second circuit pattern 105 of the PCB 101 and the second connection terminals 255 of the socket 250. In this case, the ground pattern of the main board 200 may have a large area in order to discharge static electricity introduced from the memory module 100.

For convenience of explanation, the memory module 100 including the PCB 101 having a single layered structure is illustrated in the present example embodiment. However, the present invention is not limited thereto.

For example, the PCB 101 of the memory module 100 may have a multi-layered structure. In this case, the first circuit pattern 104 may be formed within a multi-layered PCB (not shown) and thus may not be exposed to the outside, and a plurality of pads (not shown) on which the memory devices 110 may be mounted may be formed on an outermost layer of the multi-layered PCB. The second circuit pattern 105 may be formed on the outermost layer of the PCB where the pads are formed, and may have a floating structure by interposing at least one layer of the PCB between the first circuit pattern 104 and the second circuit pattern 105.

As explained above, FIG. 1 illustrates a schematic diagram of a system 300 that includes a plurality of memory devices 110. FIGS. 2 and 3 illustrate similar systems 300' and 300". For the sake of brevity, components that are common to each of the systems 300, 300', and 300" are not described and only the differences will be discussed. In the example embodiment illustrated in FIG. 2, the system 300' is similar to the system 300 illustrated in FIG. 1 except that the system 300' includes an Isolation Memory Buffer (IMB). In the example embodiment illustrated in FIG. 3, the system 300" is similar to the system 300 illustrated in FIG. 1 except that the system 300" includes an Advanced Memory Buffer (AMB).

Figure 5:
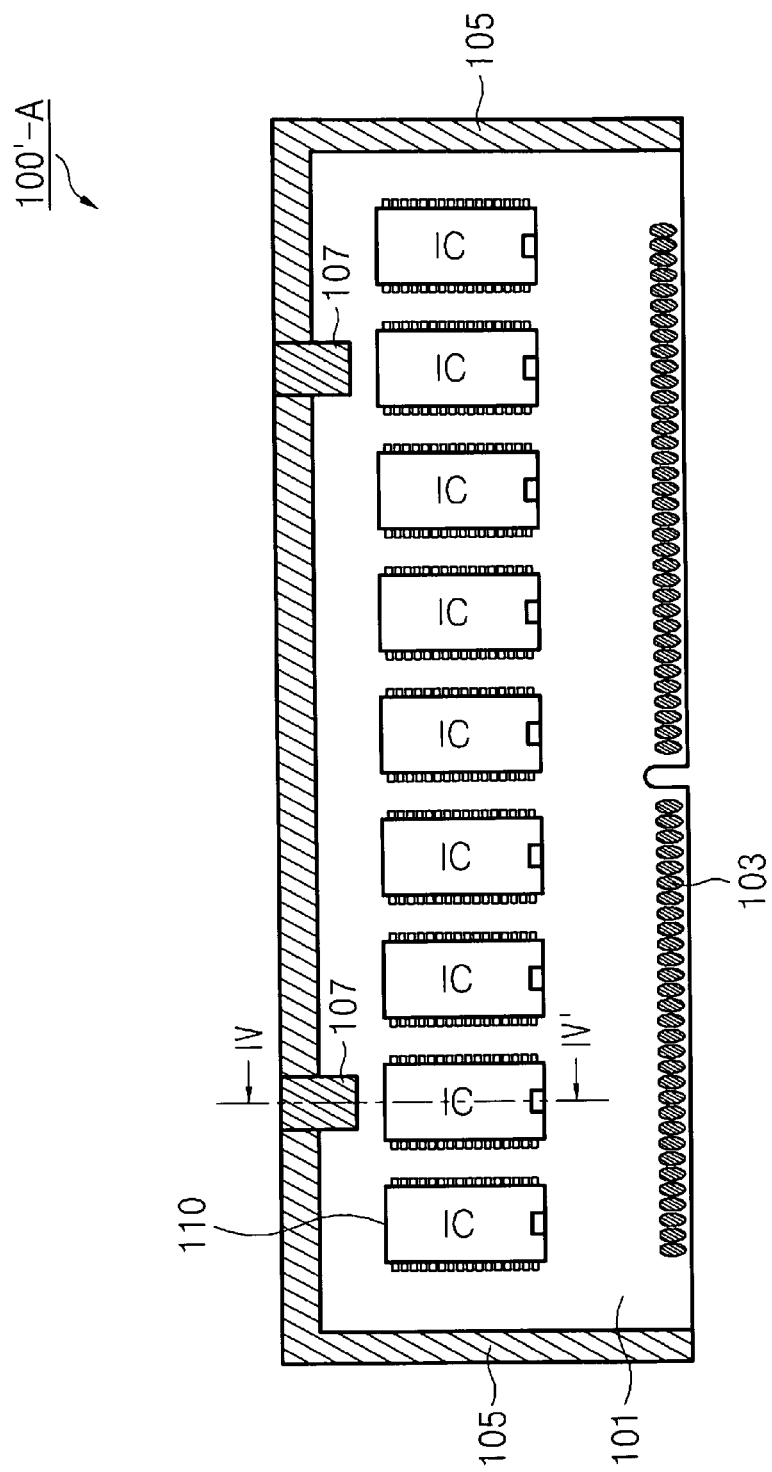
FIG. 5 is a schematic diagram of a memory module for preventing ESD, according to another example embodiment of the present invention.
Figure 8:
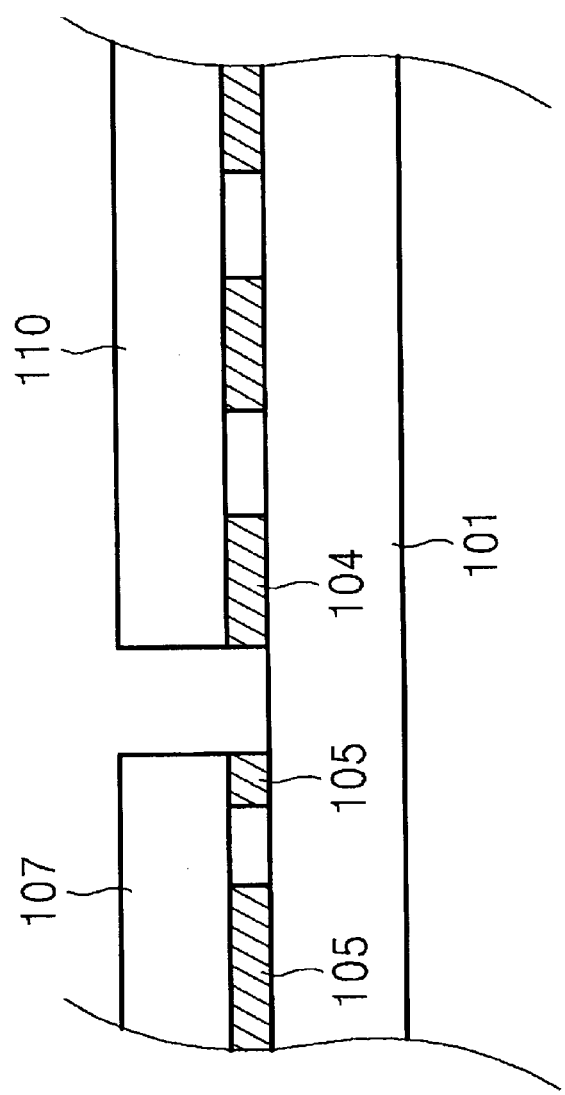
FIG. 8 is a cross-section of the memory module of FIGS. 5, 6, and 7 taken along line IV~IV' of FIGS. 5, 6, and 7.

FIG. 5 is a schematic diagram of a memory module 100'-A for preventing ESD, according to another example embodiment of the present invention. FIG. 8 is a cross-section of the memory module 100' taken along line IV~IV' of FIG. 5.

The memory module 100'-A according to the present example embodiment may have the same structure as the memory module 100 illustrated in FIGS. 1 and 4 except for the following things. For example, the memory module 100'-A of FIG. 5 may have the same structure as the memory module 100 illustrated in FIGS. 1 and 4 except that at least one storage device, for example, at least one capacitor 107, is connected to the second circuit pattern 105 of the PCB 101.

Referring to FIGS. 5 and 8, the memory module 100'-A according to the present example embodiment may include the PCB 101, the memory devices 110, and the at least one capacitor 107.

The PCB 101 may include the first circuit pattern 104 formed on the first area and the second circuit pattern 105 formed on the second area. The memory devices 110 may be mounted on and connected to the first circuit pattern 104 of the PCB 101. The first circuit pattern 104 may be connected to the terminals 103 formed in the lower portion of the PCB 101. The first circuit pattern 104 of the PCB 101 may be shielded by the memory devices 110 and may not be connected to the second circuit pattern 105. In order to increase the shielding effect, a protection film (not shown) may be further formed on a portion of the first circuit pattern 104 other than a portion of the first circuit pattern 104 on which the memory devices 110 are mounted.

At least one capacitor 107 may be mounted on and/or connected to the second circuit pattern 105 of the PCB 101. The capacitor 107 may be a capacitive storage device capable of storing static electricity introduced from the outside via the second circuit pattern 105 of the PCB 101. Although FIG. 8 illustrates the capacitors 107 as being on the second circuit pattern 105, example embodiments are not limited thereto. For example, the capacitors 107 may be on an area of an exposed surface of the PCB 101 that is apart from the second circuit pattern 105 and a conducting structure may be provided on the PCB 101 to connect the capacitor 107 to the second circuit pattern 105 to allow the static electricity to flow from the second circuit pattern 105 to the capacitor 107. In the event a layered PCB is used, the capacitors 107 may be formed in a layer which is embedded within the PCB and a conducting structure may be provided in the layered PCB to electrically connect the capacitor 107 to the second circuit pattern.

As described above with reference to FIGS. 5 and 8, when static electricity introduced from the outside, for example, static electricity generated from people or machines, has entered the memory module 100'-A, the memory module 100'-A according to the present example embodiment may effectively discharge the static electricity.

For example, if static electricity is flowed from the outside into the memory module 100'-A before the memory module 100'-A is inserted into the socket 250, the static electricity may be stored in the capacitor 107 via the second circuit pattern 105 formed along the outer edge of the PCB 101 of the memory module 100'-A. In this example embodiment, the first circuit pattern 104 of the PCB 101 of the memory module 100'-A may be in a shielded state, and the second circuit pattern 105 thereof may be in an exposed state. When the memory module 100'-A is inserted into the socket 250 after the static electricity is stored in the capacitor 107, the static electricity stored in the capacitor 107 may be discharged into the ground pattern of the main board 200 via the second circuit pattern 105 of the PCB 101 and the second connection terminals 255 of the socket 250. In this case, the ground pattern of the main board 200 may have a large area in order to discharge static electricity introduced from the memory module 100'-A.

In other words, the memory module 100 or 100'-A according to the example embodiments of the present invention forms a conductive circuit pattern exposed to the outside, for example, the second circuit pattern 105, on the PCB 101, thereby discharging static electricity introduced from the outside to a ground pattern of a system, that is, the main board 200, via the second circuit pattern 105.

As explained above, FIG. 5 illustrates a schematic diagram of a memory module 100'-A having a plurality of memory devices 110. FIGS. 6 and 7 illustrate similar memory modules 100'-B and 100'-C. For the sake of brevity, components that are common to each of the memory modules 100'-A, 100'-B, and 100'-C are not described and only the differences will be discussed. In the example embodiment illustrated in FIG. 6, the module 100'-B is similar to the module 100'-C illustrated in FIG. 5 except that the module 100'-B includes an Isolation Memory Buffer (IMB). In the example embodiment illustrated in FIG. 7, the memory module 100'-C is similar to the memory module 100'-A illustrated in FIG. 5 except that the memory module 100'-C includes an Advanced Memory Buffer (AMB).

According to an example embodiment of the present invention, a memory module for preventing ESD and a system including the same forms an ESD preventing structure capable of discharging static electricity introduced from the outside into an outside structure such as a ground of the system, thereby preventing the memory module from being damaged due to the static electricity and improving the reliability of an operation of the memory module.

While example embodiments of the present invention has been particularly shown and described with reference to example embodiments thereof, it will be understood that various changes in form and details may be made therein without departing from the spirit and scope of the following claims.

What is claimed is:

1. A memory module having an ElectroStatic Discharge (ESD) prevention structure, the memory module comprising:
    a printed circuit board;
    a first circuit pattern on the printed circuit board;
    a second circuit pattern on the printed circuit board, the second circuit pattern configured to discharge static electricity introduced to the memory module from outside the memory module, the second circuit pattern not being connected to the first circuit pattern and being along an outer edge of the printed circuit board; and
    at least one capacitor on the second circuit pattern, the at least one capacitor connected to the second circuit pattern and configured to store the static electricity.

2. The memory module of claim 1, wherein the second circuit pattern is a conductive material and is exposed to the outside.

3. The memory module of claim 1, further comprising:
    at least one memory device connected to the first circuit pattern.

4. The memory module of claim 3, wherein the first circuit pattern is partially covered by the at least one memory device.

5. The memory module of claim 1, wherein the printed circuit board includes a nonconductive layer covering the first circuit pattern and the second circuit pattern is on the nonconductive layer.

6. The memory module of claim 1, wherein the first circuit pattern is in a shielded state and the second circuit pattern is in an exposed state.

7. The memory module of claim 1, wherein the printed circuit board is multi-layered and the first circuit pattern is formed therewithin.

8. A system comprising:
    a main board on which a plurality of electronic components are mounted;
    a socket on the main board; and
    a memory module in the socket and connected to the main board via the socket,
    wherein the memory module includes
        a printed circuit board,
        a first circuit pattern on the printed circuit board,
        a second circuit pattern on the printed circuit board, the second circuit pattern configured to discharge static electricity introduced to the memory module from outside the memory module, the second circuit pattern not being connected to the first circuit pattern and being along an outer edge of the printed circuit board, and
        at least one capacitor on the second circuit pattern, the at least one capacitor connected to the second circuit pattern and configured to store the static electricity.

9. The system of claim 8, wherein the second circuit pattern is connected to a ground pattern of the main board via the socket, wherein the static electricity is discharged into the ground pattern of the main board from the second circuit pattern and the socket.

10. The system of claim 8, wherein the second circuit pattern conducts the static electricity from the at least one capacitor to a ground pattern on the main board.

11. The system of claim 8, wherein the second circuit pattern is an exposed conductive material.

12. The system of claim 8, wherein the memory module further includes a memory device on the printed circuit board.

13. The system of claim 8, wherein the printed circuit board includes a nonconductive layer covering the first circuit pattern and the second circuit pattern is on the nonconductive layer.

* * * * *